US00RE37452B1

(19) United States
(12) Reissued Patent
Donnelly et al.

(10) Patent Number: US RE37,452 E
(45) Date of Reissued Patent: Nov. 20, 2001

(54) AT FREQUENCY PHASE SHIFTING CIRCUIT FOR USE IN A QUADRATURE CLOCK GENERATOR

(75) Inventors: Kevin S. Donnelly, Los Altos; Pak Shing Chau, San Jose, both of CA (US)

(73) Assignee: Rambus Inc., Los Altos, CA (US)

(21) Appl. No.: 09/654,861

(22) Filed: Sep. 1, 2000

Related U.S. Patent Documents

Reissue of:
(64) Patent No.: 5,808,498
Issued: Sep. 15, 1998
Appl. No.: 08/891,128
Filed: Jul. 10, 1997

U.S. Applications:
(

(63) Continuation of application No. 08/452,074, filed on May 26, 1995, now abandoned.

(51) Int. Cl.[7] ..... H03H 11/16
(52) U.S. Cl. ..... 327/255; 327/238; 327/254; 327/344
(58) Field of Search ..... 327/155, 156, 327/158, 161, 163, 231, 237, 238, 254, 255, 243, 244, 245

(56) References Cited

U.S. PATENT DOCUMENTS

| | | | |
|---|---|---|---|
| 3,296,517 | 1/1967 | Routh et al. | 327/231 |
| 3,546,604 | 12/1970 | White | 238/155 |

(List continued on next page.)

FOREIGN PATENT DOCUMENTS

| | | | |
|---|---|---|---|
| 3816973-A1 | 5/1988 | (DE) | H03K/5/04 |
| 4018615-A1 | 12/1990 | (DE) | H03K/5/156 |
| 054323A3 | 6/1982 | (EP) | 11/20 |
| 0521215-A1 | 1/1993 | (EP) | G11B/20/10 |
| 490690 A1 | 6/1992 | (EP) | H03F/3/45 |
| 0377897-A2 | 7/1990 | (EP) | H03K/5/08 |
| 0130384-A1 | 9/1985 | (EP) | H03K/5/15 |
| 0343899-A3 | 11/1989 | (EP) | H03K/5/156 |
| 0398751-A2 | 11/1990 | (EP) | H03K/5/156 |
| 2670975-A1 | 6/1992 | (FR) | H04L/27/18 |
| 2249442-A | 5/1992 | (GB) | H03B/27/00 |
| 5535516 | 12/1980 | (JP) . | |
| 61228720 | 11/1986 | (JP) | H03K/3/282 |
| 4010810 | 1/1992 | (JP) | H03K/7/06 |

OTHER PUBLICATIONS

Enam, S. Khursheed and Asad A. Abidi, "NMOS IC's for Clock and Data Regeneration in Gigabit–Per–Second Optical–Fiber Receivers"; IEEE Jounal of Solid–State Circuits; vol. 27, No. 12; Dec., 1992; pp. 1763–1774.

Knotts, Thomas A. et al, "A 500 MHz Time Digitizer IC with 15.625ps Resolution"; 1994 IEEE International Solid State circuits Conference; p. 58 ,59; Feb., 1994.

Sonntag, Jeff, and Leonowich, Robert, "High Speed communication IC's"; 1990 IEEE International Solid–State Circuits Conference Digest of Technical Papers, San Francisco, CA Feb. 14–16, 1990; pp. 194–196.

International Search Report / Internation Application No. PCT/US96/07288; International Filing Date: May 21, 1996; Mailing date: Sep. 13, 1996.

*Primary Examiner*—Toan Tran
(74) *Attorney, Agent, or Firm*—Charles E. Shemwell

(57) ABSTRACT

A phase shifting circuit that may be used as part of a quadrature clock generator. The phase shifting circuit comprises a triangle wave generator coupled to receive an input reference signal. The triangle wave generator outputs a pair of complementary triangle wave signals in response to the input reference signal. A comparator having a pair of inputs is coupled to receive the pair of complementary triangle wave signals. The comparator outputs an output signal having a predetermined phase relationship with the input reference signal in response to a comparison between the pair of complementary triangle wave signals.

42 Claims, 7 Drawing Sheets

U.S. PATENT DOCUMENTS

| | | | | |
|---|---|---|---|---|
| 3,555,458 | | 1/1971 | Fombonne | 332/44 |
| 3,911,368 | | 10/1975 | Tarczy-Hornoch | 328/155 |
| 3,921,079 | * | 11/1975 | Heffner et al. | 327/241 |
| 3,965,433 | | 6/1976 | Yeh | 328/155 |
| 3,982,190 | | 9/1976 | Schaefer | 328/110 |
| 3,997,772 | | 12/1976 | Crochiere et al. | 235/152 |
| 4,021,742 | | 5/1977 | Machida | 329/50 |
| 4,110,641 | | 8/1978 | Payne | 307/355 |
| 4,151,463 | | 4/1979 | Kibler | 324/82 |
| 4,156,851 | | 5/1979 | Winters | 328/155 |
| 4,285,006 | | 8/1981 | Kurahashi et al. | 358/35 |
| 4,607,229 | | 8/1986 | Isobe et al. | 328/155 |
| 4,623,805 | | 11/1986 | Flora et al. | 307/602 |
| 4,635,097 | | 1/1987 | Tatami | 358/13 |
| 4,638,190 | | 1/1987 | Hwang et al. | 307/512 |
| 4,644,196 | | 2/1987 | Flannagan | 307/530 |
| 4,719,365 | | 1/1988 | Misono | 307/269 |
| 4,721,904 | | 1/1988 | Ozaki et al. | 324/83 |
| 4,724,337 | | 2/1988 | Maeda et al. | 307/262 |
| 4,739,279 | | 4/1988 | Pion | 328/155 |
| 4,745,370 | * | 5/1988 | McGinn | 327/237 |
| 4,746,819 | | 5/1988 | Kashiwagi | 307/511 |
| 4,789,799 | | 12/1988 | Taylor et al. | 307/540 |
| 4,806,888 | | 2/1989 | Salvage et al. | 333/138 |
| 4,813,005 | | 3/1989 | Redig et al. | 364/580 |
| 4,866,397 | * | 9/1989 | Kimyacioglu | 327/237 |
| 4,870,303 | | 9/1989 | McGinn | 307/511 |
| 4,878,143 | * | 10/1989 | Kalal et al. | 327/104 |
| 4,893,094 | | 1/1990 | Herold et al. | 331/1 A |
| 4,908,532 | * | 3/1990 | Chadwick | 327/238 |
| 4,935,701 | | 6/1990 | Kawai et al. | 328/155 |
| 4,992,757 | | 2/1991 | Shin'e | 330/254 |
| 4,994,773 | | 2/1991 | Chen et al. | 333/164 |
| 5,015,872 | | 5/1991 | Rein | 307/269 |
| 5,095,233 | | 3/1992 | Ashby et al. | 307/603 |
| 5,111,083 | * | 5/1992 | Nakamura | 327/98 |
| 5,123,020 | | 6/1992 | Yoshimura et al. | 371/68.1 |
| 5,126,693 | | 6/1992 | Gulliver et al. | 331/14 |
| 5,157,276 | | 10/1992 | Metz | 307/262 |
| 5,164,838 | | 11/1992 | Okuda | 358/326 |
| 5,179,303 | | 1/1993 | Searls et al. | 307/603 |
| 5,182,476 | | 1/1993 | Hanna et al. | 307/491 |
| 5,187,448 | | 2/1993 | Brooks et al. | 330/258 |
| 5,220,294 | | 6/1993 | Ichikawa | 331/17 |
| 5,223,755 | | 6/1993 | Richley | 307/603 |
| 5,248,946 | | 9/1993 | Murakami et al. | 330/253 |
| 5,309,162 | | 5/1994 | Uematsu et al. | 342/372 |
| 5,317,288 | | 5/1994 | Yung et al. | 332/144 |
| 5,334,953 | | 8/1994 | Mijuskovic | 331/8 |
| 5,410,263 | | 4/1995 | Waizman | 327/141 |
| 5,422,529 | | 6/1995 | Lee | 330/257 |
| 5,432,480 | | 7/1995 | Popescu | 331/11 |
| 5,543,742 | * | 8/1996 | Takeda et al. | 327/238 |

* cited by examiner

AT FREQUENCY PHASE SHIFTING CIRCUIT FOR USE IN A QUADRATURE CLOCK GENERATOR

Matter enclosed in heavy brackets [ ] appears in the original patent but forms no part of this reissue specification; matter printed in italics indicates the additions made by reissue.

This is a continuation of application No. 08/452,074, filed May 26, 1995, now abandoned.

FIELD OF THE INVENTION

The present invention relates generally to phase shifting circuits and more particularly to a phase shifting circuit that may be used in quadrature clock generator for [for] providing quadrature output signals.

BACKGROUND OF THE INVENTION

A quadrature clock generator may be used in a delay locked loop (DLL) to provide two clock signals that are 90 degrees out of phase with one another. Typically, a first output clock signal (the "I" output clock signal) is in phase with the input reference clock signal, and a second output clock signal (the quadrature or "Q" output clock signal) is 90 degrees out of phase with the input reference clock signal. Both output clock signals of the quadrature clock generator have the reference frequency. The output clock signals are phase mixed to provide a desired phase difference or delay between the output clock signal of the DLL and the input reference clock.

Cyclic variations from the desired phase difference between the output clock signals of the quadrature clock generator result in "jitter." For DLL purposes, the jitter of the quadrature clock generator affects the timing margins of the DLL, increasing lock acquisition time for the DLL. Therefore, reduced jitter is desirable.

According to one prior art method, a quadrature clock generator first divides the frequency of the input reference clock signal by two and then operates on the reduced frequency signal to produce two clock signals that are 90 degrees out of phase with one another. A DLL using a frequency dividing quadrature clock generator then must double the frequency of the clock signals to produce the desired output clock signals of the original frequency.

According to an alternative prior art method, a quadrature clock generator operates "at frequency" to provide quadrature clock signals without the intermediate steps of frequency dividing and doubling. A fixed delay element is typically used to provide the desired phase relationship. When compared to frequency dividing quadrature clock generators, at frequency quadrature clock generators have the advantages of reduced circuit complexity, reduced die area, and reduced power consumption.

Generally, frequency dividing quadrature clock generators are able to maintain the desired phase relationship between the output clock signals over a wider range of input reference clock frequencies than at frequency quadrature clock generators. Furthermore, when compared to at frequency quadrature clock generators, frequency dividing quadrature clock generators are better able to maintain the desired phase relationship in view of process variations, supply variations, and temperature variations.

Wherein frequency dividing quadrature clock generators are capable of providing adequate jitter performance, a DLL that uses a frequency dividing quadrature clock generators may exhibit bi-modal jitter (and therefore worse timing margins) due to the mismatching of components used in the frequency doubling. Thus, the components of frequency dividing quadrature clock generator must be closely matched to reduce jitter, further increasing the cost of manufacturing a frequency dividing quadrature clock generator.

SUMMARY AND OBJECTS OF THE INVENTION

Therefore, an object of the invention is to provide an at frequency quadrature clock generator having improved jitter performance.

These and other objects are provided by a quadrature clock generator that includes an at frequency phase shifting circuit for providing the Q output clock signal and a first comparator for providing the I output clock signal. Both the phase shifting circuit and the second comparator are coupled to receive an input reference clock signal. The phase shifting circuit comprises a triangle wave generator coupled in series with a second comparator. The triangle wave generator outputs a pair of complementary triangle wave signals in response to the input reference signal. The second comparator outputs the Q output clock signal in response to a comparison between the pair of complementary triangle wave signals. To better ensure that the output clock signals of the first comparator and the phase shifting circuit are in quadrature, the first and second comparators are matched such that the propagation delays associated with the comparators are equal.

According to alternative embodiments, the phase shifting circuit may be used alone to provide a predetermined fixed delay. Further, the quadrature clock generator may be used as a component of a DLL.

BRIEF DESCRIPTION OF THE DRAWINGS

The present invention illustrated by way of example and not limitation in the figures of the accompanying drawings, in which like references indicate similar elements, and in which.

DETAILED DESCRIPTION

A phase shifting circuit that operates at frequency and may be incorporated as part of a quadrature clock generator is described herein. The phase shifting circuit generally comprises a triangle wave generator coupled in series with a comparator. The triangle wave generator receives a periodic input signal and outputs two complementary triangle wave signals. The comparator compares the value of the first triangle wave to the value of the second triangle wave, outputting a logic high value when the first triangle wave is greater than the second triangle wave and a logic low value when the first triangle wave is less than the second triangle wave.

The output of the comparator transitions between logic high and logic low values when the first and second triangle waves are equal. Assuming that the input signal has a 50% duty cycle, the output signal of the comparator transitions approximately 90 degrees out of phase with the transitions of the input signal. The phase shift circuit may be used to provide the Q output clock signal of a quadrature clock generator, wherein a second comparator having approximately the same delay as the comparator of the phase shift circuit is coupled to the input signal for providing the I output clock signal of the quadrature clock generator.

Figure 1:
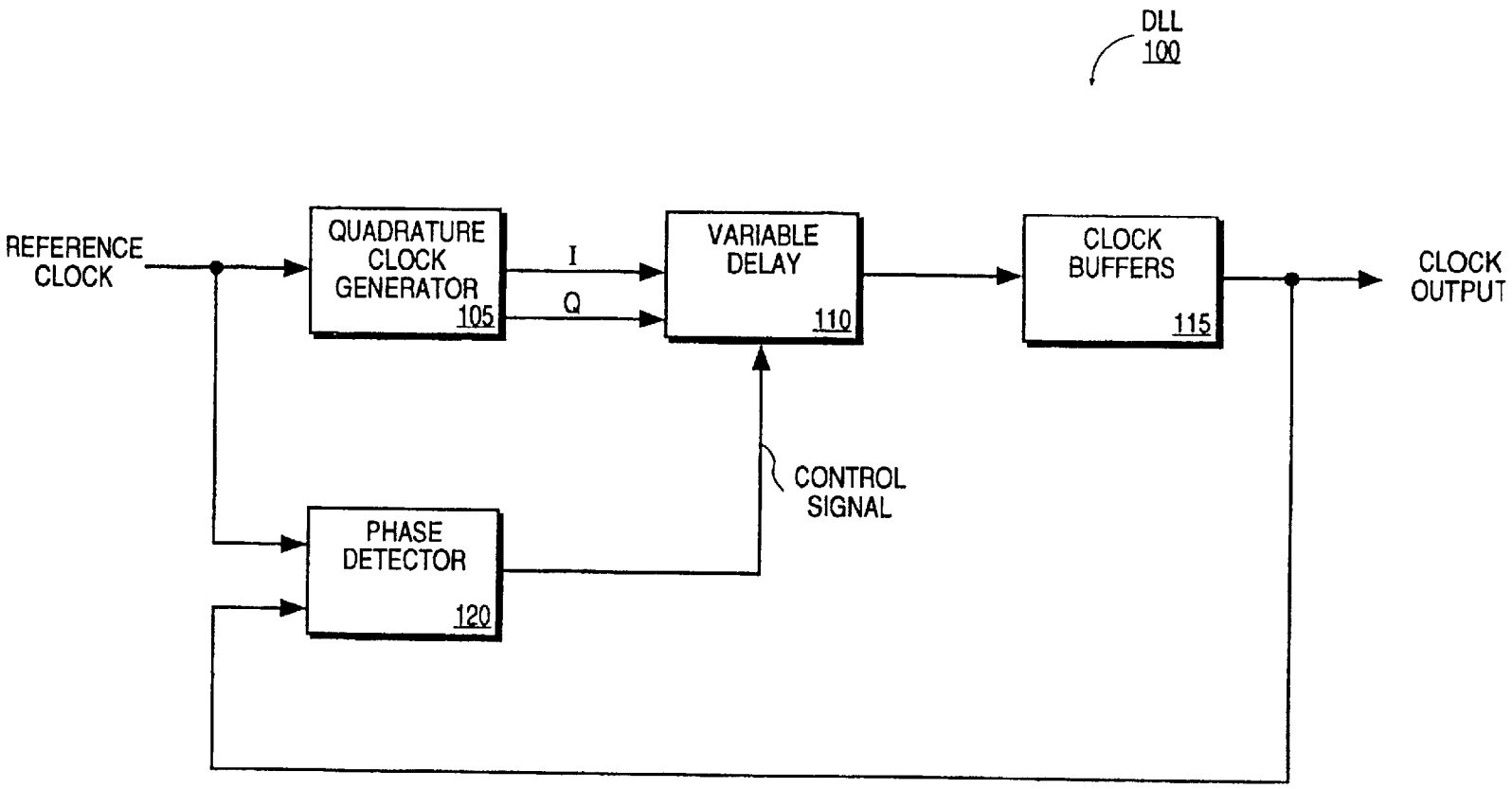
FIG. 1 shows a delay locked loop that includes a quadrature clock generator and phase shifting circuit according to one embodiment.

FIG. 1 is a simplified block diagram of delay locked loop (DLL) 100 that includes quadrature clock generator 105, variable delay 110, clock buffers 115, and phase detector 120. A reference clock signal having a 50% duty cycle is provided as an input to the quadrature clock generator 105. Quadrature clock generator 105 uses the input reference clock signal to generate a first output clock signal "I" that is in phase with the input reference clock signal and a second output clock signal "Q" that is 90 degrees out of phase with the I output clock signal. The I and Q output clock signals are said to be in quadrature with one another.

Variable delay 110 receives the quadrature signals from quadrature clock generator 105 and phase mixes the quadrature signals to produce a variable delay in order to generate a DLL clock output signal having the desired phase relationship to the input reference clock signal. Clock buffers 115 receive the output of variable delay 110 and buffer it to drive the large wiring capacitance load at the output of DLL 100.

As shown, the output signal of DLL 100 is fed back to phase detector 120, which also receives the input reference clock signal. Phase detector 120 compares the input reference clock signal to the output signal of the DLL and outputs a control signal that causes [phase shifter] *variable delay* 110 to adjust the relative phase of the output signal of DLL 100 by adjusting the phase mixing of the I output clock signal and the Q output clock signal. The control signal may be an analog voltage or a digital signal such as a control digital word.

Figure 2:
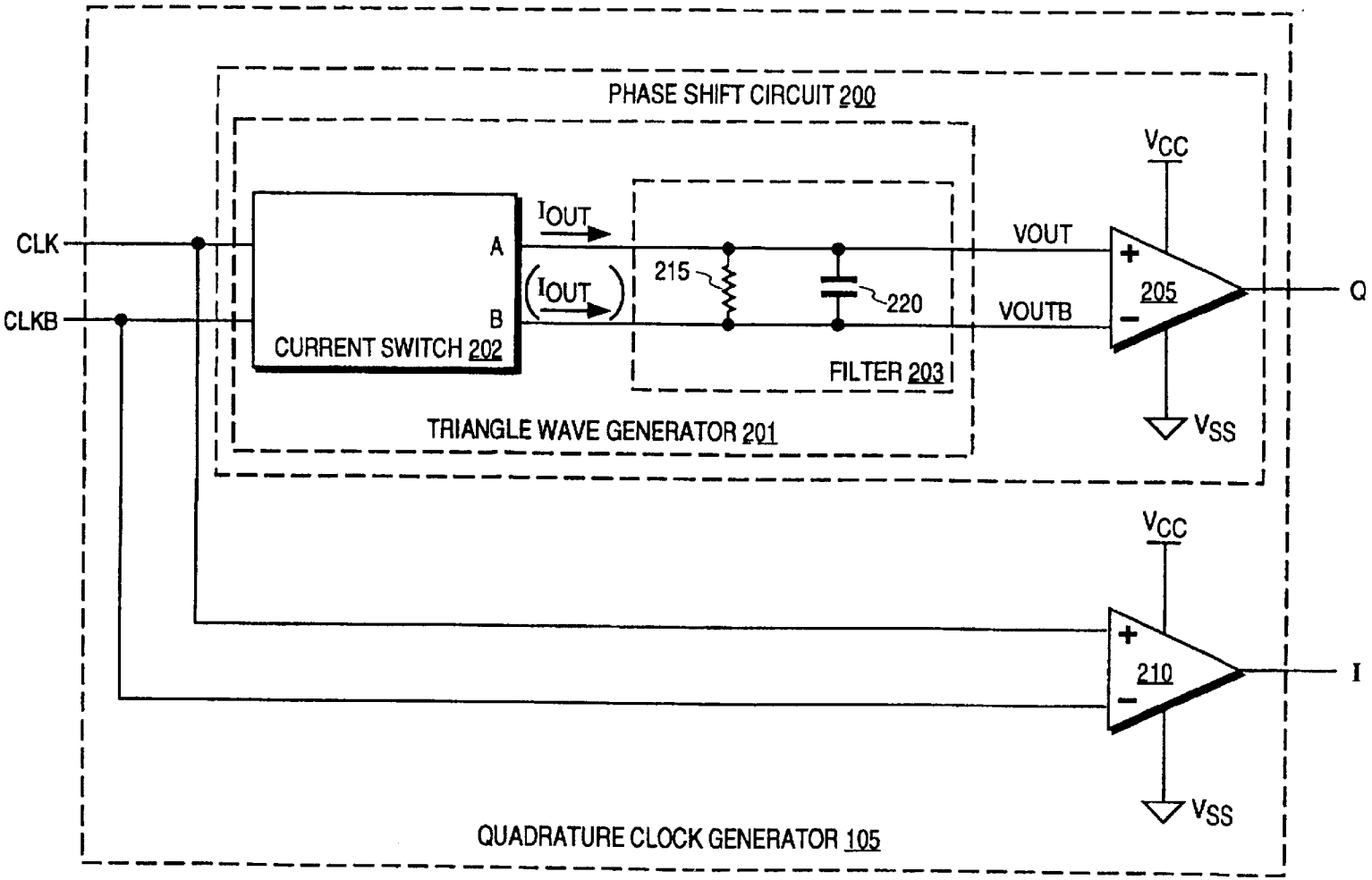
FIG. 2 shows a quadrature clock generator as including a phase shifting circuit according to one embodiment.

FIG. 2 shows a quadrature clock generator according to one embodiment. Quadrature clock generator 105 is shown as generally including a phase shift circuit 200 and a comparator 210 wherein phase shift circuit 200 provides the Q output signal and comparator 210 outputs the I output signal. The input reference clock signal is labeled "CLK" and is provided to the inputs of phase shift circuit 200 and comparator 210 along with a complementary reference clock signal "CLKB." The I output signal of quadrature clock generator 105 is approximately in phase with the input clock signal CLK, and the Q output signal is 90 degrees out of phase with the I output signal.

Phase shift circuit 200 is shown as including triangle wave generator 201 and comparator 205. Triangle wave generator 201 outputs a first triangle wave signal VOUT to the positive input of comparator 205 and a second complementary triangle wave signal VOUTB to the negative input of comparator 205. The complementary triangle wave signals are output in response to the complementary input reference clock signals. According to one embodiment, VOUT is the integral of input reference clock signal CLK, and VOUTB is the integral of complementary input reference clock signal CLKB.

Comparator 205 outputs a square wave signal that transitions between logic high and logic low values at zero differential crossing points wherein the values of signals VOUT and VOUTB are equal. The zero differential crossing points are approximately 90 degrees out of phase with transitions in the input reference clock signals. The delay of comparator 205 results in additional phase difference, and comparator 210 is selected to have a matching delay such that the I and Q output signals are in quadrature with one another. Thus, the delay of comparator 210 causes the I output signal to be slightly out of phase with the input reference clock signal CLK, exactly canceling the phase difference caused by the delay of comparator 205.

According to one embodiment, triangle wave generator 201 comprises a current switch 202 and a filter 203. Current switch 202 includes a pair of inputs coupled to receive CLK and CLKB and a pair of output terminals A and B for outputting an output current $I_{out}$. Filter 203 is coupled across the output terminals of current switch 202. Current switch 202 changes the direction of flow for output current out in response to complementary input clock signals CLK and CLKB. For example, wherein input clock signal CLK is logic high, the output current $I_{out}$ flows from output terminal A, through filter 203, and into output terminal B such that VOUT increases and VOUTB decreases. Wherein CLK is logic low, the output current $I_{out}$ flows from the B output terminal, through filter 203, and into output terminal A such that VOUTB increases and VOUT decreases.

Filter 203 is shown as comprising resistor 215 and capacitor 220, each of which are coupled across the output terminals of current switch 202. The values of resistor 215 and capacitor 220 are selected such that the RC time constant of filter 203 limits the slew rate of the voltages VOUT and VOUTB, preventing VOUT and VOUTB from achieving the supply voltages VCC and VSS and resulting in complementary triangle wave signals. The values of resistor 215 and capacitor 220 are also selected such that the amplitude of the triangle wave signals is as large as possible. Wherein CLK has a frequency of 250 MHz, exemplary values of resistor 215 and capacitor 220 are 4 kΩ and 0.4 pF, respectively. Resistor 215 of filter 203 may be provided by two half-value resistors and two double-value capacitors coupled in a manner such as that shown by FIG. 7.

Figure 3:
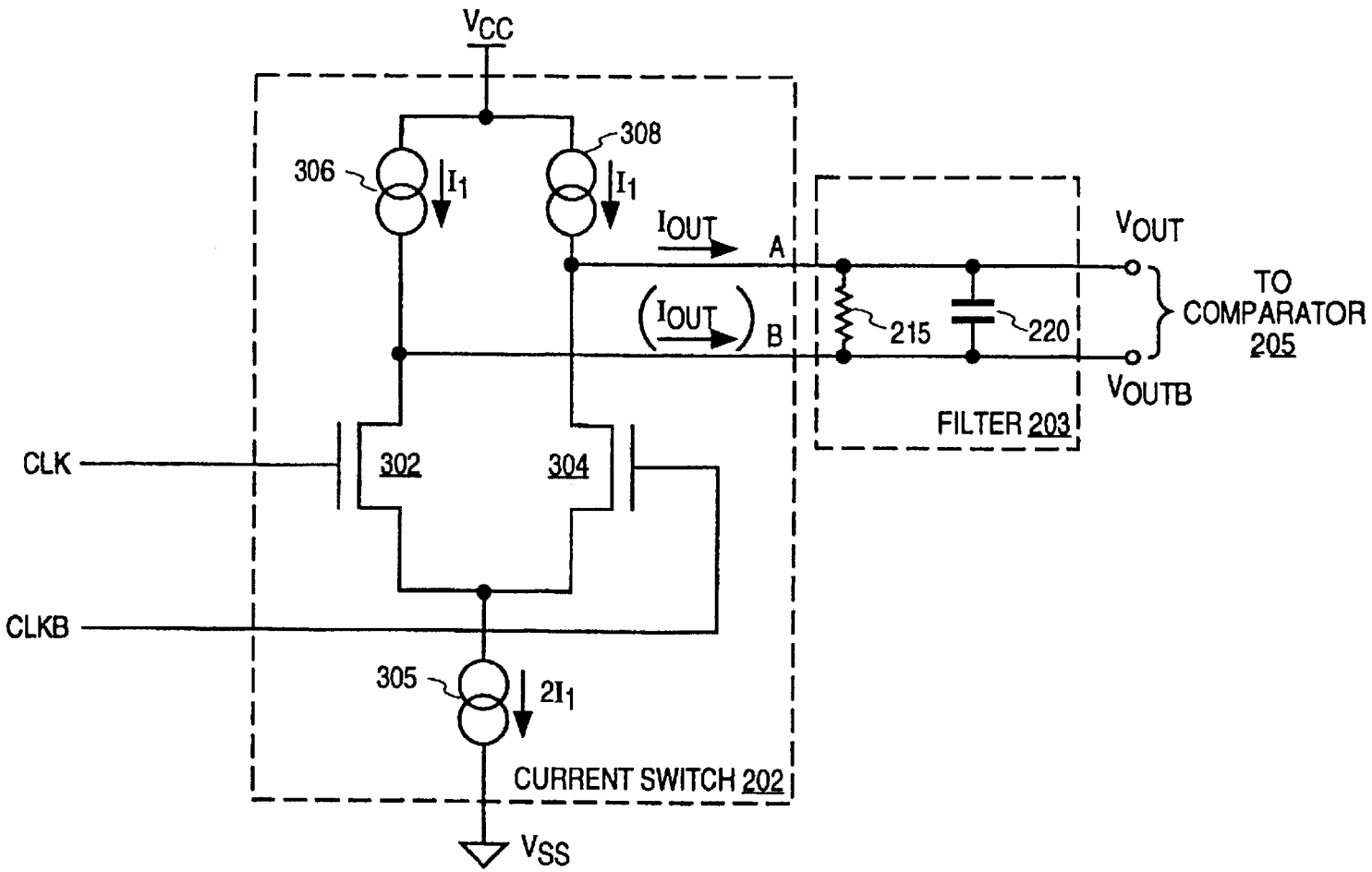
FIG. 3 shows a triangle wave generator of the phase shifting circuit [according] in more detail.

FIG. 3 shows a current switch 202 of one embodiment as generally comprising a differential pair of matched NMOS transistors 302 and 304 and current sources 305, 306, and 308. Transistor 302 has its gate coupled to receive the CLK signal and its drain coupled to the supply voltage VCC via current source 306. Similarly, transistor 304 has its gate coupled to receive the CLKB signal and its drain coupled to VCC via current source 308. The sources of transistors 302 and 304 are commonly coupled to system ground VSS via current source 305. Current sources 306 and 308 each source a current I, and current source 305 sinks a current having twice the value of $I_1$.

As shown, output terminal A of current switch 202 is coupled to the drain of transistor 304, and output terminal B is coupled to the drain of transistor 302. Therefore, the drains of transistor 302 and 304 are coupled to one another via filter 203 such that filter 203 provides a conducting path to system ground VSS. Wherein transistor 302 is switched off and transistor 304 is switched on, the current provided by current source 306 is diverted through filter 203 and transistor 304 to system ground VSS such that the voltage VOUTB at output terminal B increases relative to the voltage VOUT at output terminal A. Similarly, wherein transistor 302 is switched on and transistor 304 is switched off, the current provided by current source 308 is diverted through filter 203 and transistor 302 to system ground VSS such that the voltage VOUT increases relative to the voltage VOUTB. Because NMOS transistors 302 and 304 are matched and current sources 306 and 308 are matched, the amplitudes of VOUT and VOUTB are equal.

Figure 4:
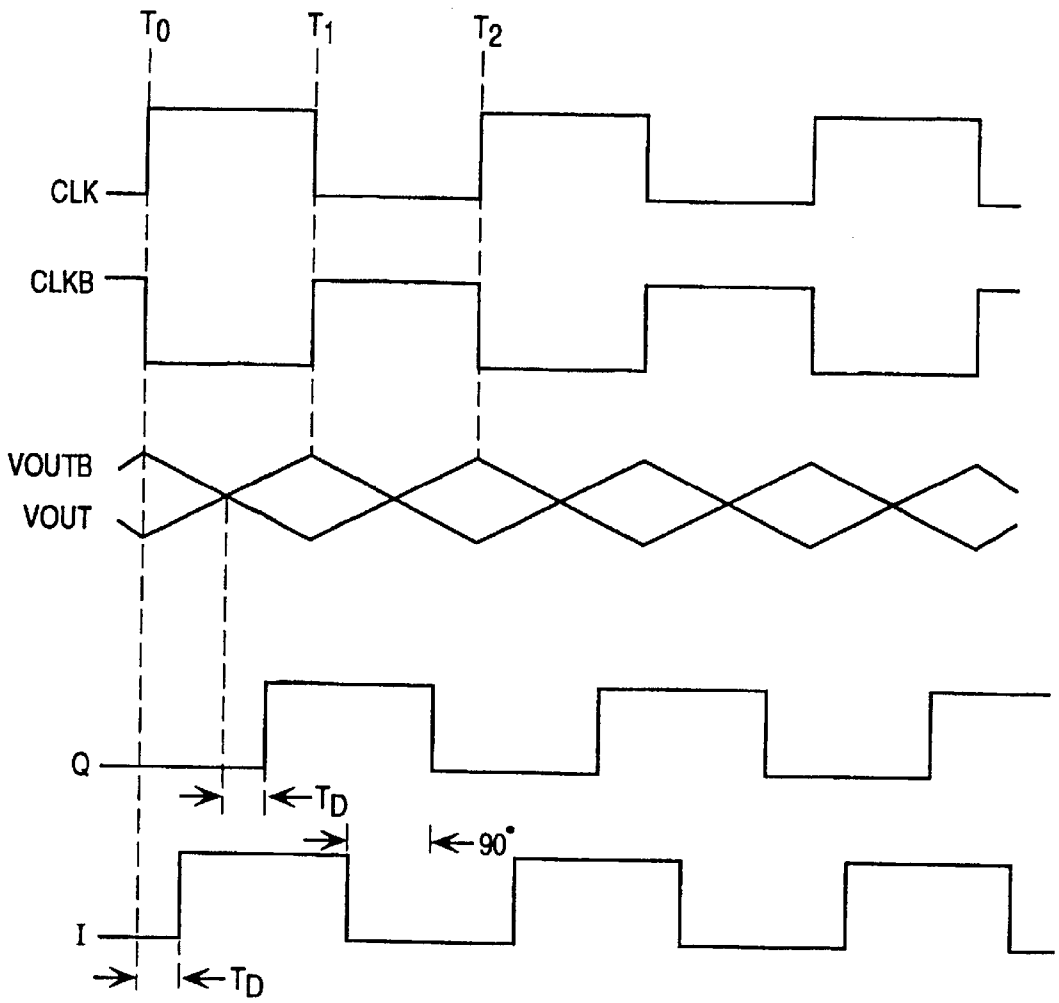
FIG. 4 illustrates the operation of a quadrature clock generator and phase shifting circuit according to one embodiment.

FIG. 4 shows several waveforms that illustrate the operation of current switch 202 and quadrature clock generator 105. Specifically, FIG. 4 shows complementary input reference clock signals CLK and CLKB, complementary triangle wave signals VOUT and VOUTB, and quadrature output signals Q and I.

At time TO, CLX transitions from a logic low value to a logic high value, complementary clock signal CLKB transitions from a logic high value to a logic low value, and voltages VOUTB and VOUT are at their maximum and minimum values, respectively. While CLK is logic high and CLKB is logic low, transistor 302 is switched on and transistor 304 is switched off such that current source 308 provides a current $I_1$ that flows from output terminal A, through filter 203, and to system ground VSS via output terminal B and transistor 302. Thus, at time TO, VOUT begins to increase, and VOUTB begins to decrease.

Because the components of current switch generator 202 are matched, the time rate of change for VOUT and VOUTB are of equal magnitude and opposite polarity. Further, the RC time constant of filter 203 limits the slew rate of VOUT and VOUTB such that both signals are triangle wave signals that swing between a maximum value, $V_{max}$, that is less than VCC and a minimum value, $V_{min}$, that is greater than VSS. For these reasons, the values of VOUT and VOUTB are equal half way between times TO and Ti, when CLK transitions from high to low. Thus, the differential crossing points of the triangle wave signals VOUT and VOUTB occur 90 degrees out of phase with transitions of input reference clock signal CLK.

Comparator 205 (shown in FIG. 2) detects the differential crossing point and causes the Q output signal to transition from logic low to logic high. The transition time of comparator 205 introduces a delay $T_D$ in the Q output signal of quadrature clock generator 200 such that the Q output signal is actually (90+$\phi$) degrees out of phase with CLK, wherein $\phi$ is the phase difference corresponding to the delay $T_D$. The delay of comparator 210 is selected such that the I output signal also includes a delay $T_D$. Thus, the Q output signal is exactly 90 degrees out of phase with the I output signal.

At time T1, CLK transitions from high to low, CLKB transitions from low to high, and voltages VOUT and VOUTB are at their maximum and minimum values, respectively. While CLK is logic low and CLKB is logic high, transistor 304 is switched on and transistor 302 is switched off such that current source 306 provides a current $I_1$ that flows from output terminal B, through filter 203, and to system ground VSS via output terminal A and transistor 304. Thus, at time T1, VOUTB begins to increase, and VOUT begins to decrease. Another zero differential crossing point occurs halfway between times T1 and T2. Comparator 205 detects the zero differential crossing point and causes the Q output signal to transition from logic high to logic low. At time T2, CLK transitions from low to high.

Thus far, it has been assumed that the Q output signal has a 50% duty cycle. If the input reference clock signal CLK does not have a 50% duty cycle, or if there are component mismatches, the rising and falling edges of the triangle waves may not be centered around the same voltage, and the Q output signal therefore may not have a 50% duty cycle. For the purposes of DLL 100, it is desirable that the Q output signal have a 50% duty cycle. Therefore, the quadrature clock generator 105 shown in FIG. 5 includes additional circuitry for correcting duty cycle errors.

Figure 5:
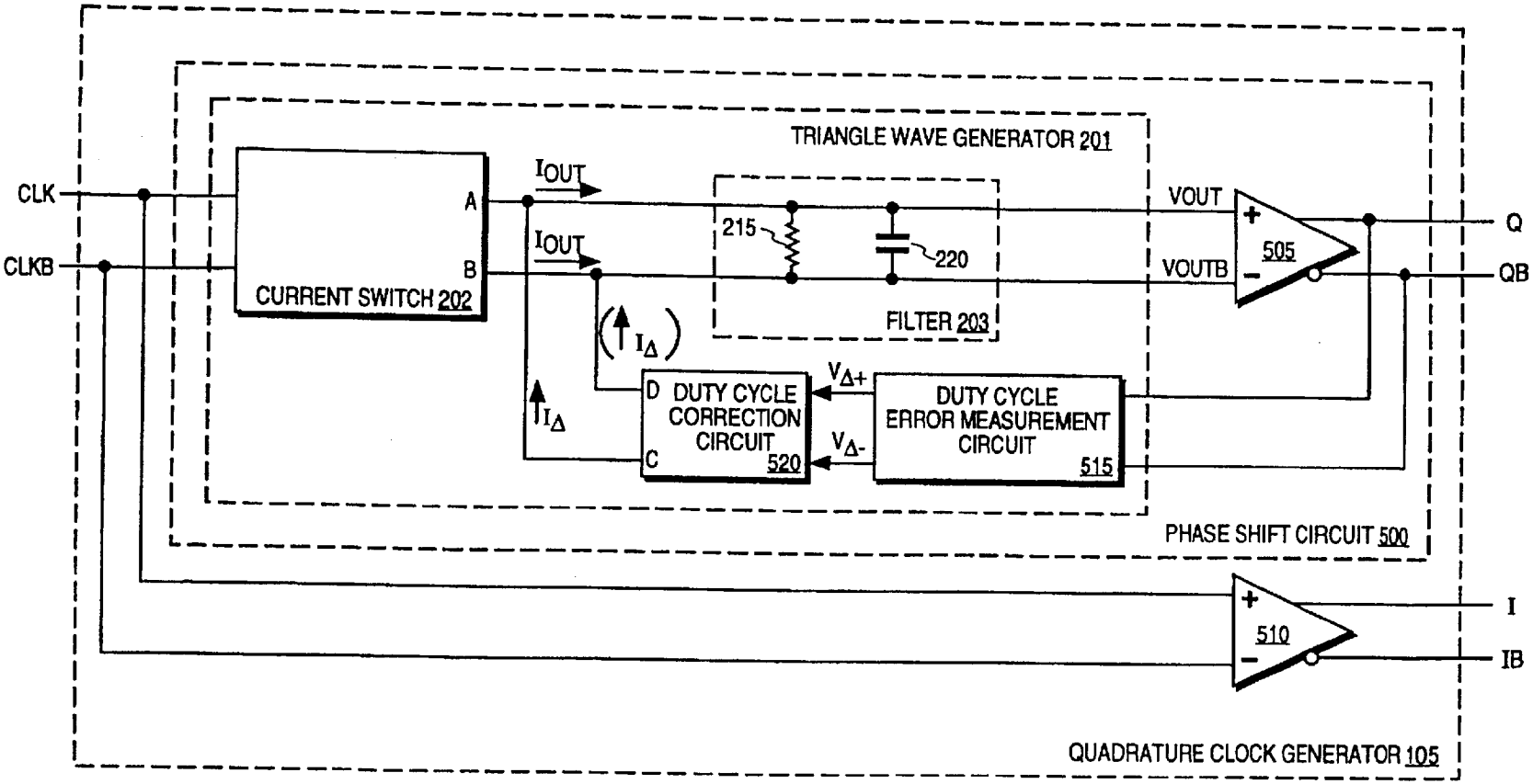
FIG. 5 shows a quadrature clock generator as including a phase shifting circuit with duty cycle error correction.

Specifically, the embodiment of quadrature clock generator 105 shown in FIG. 5 includes a duty cycle error measurement circuit 515 coupled in series with a duty cycle correction circuit 520. Duty cycle error measurement circuit 515 and duty cycle correction circuit 520 are coupled in a feedback configuration between the output of comparator 505 of phase shift circuit 500 and the output of current switch 202 of triangle wave generator 201.

As shown, comparator 505 includes a complementary output that outputs a QB output signal that is 180 degrees out of phase with the Q output signal. The Q and QB output signals are provided as inputs to duty cycle error measurement circuit 515, which may be manufactured in accordance with the disclosure of the following patent application, which is hereby incorporated by reference: U.S. application Ser. No. 08/196,711, entitled "Amplifier With Active Duty Cycle Correction", and commonly assigned to Rambus, Inc. of Mountain View, Calif.

Duty cycle error measurement circuit 515 outputs differential error voltages $V_{\Delta+}$ and $V_{\Delta-}$ in response to detecting a difference between the duty cycle of the Q output signal and a 50% duty cycle. Duty cycle error measurement circuit 515 includes a filter (not shown) that results in error voltage $V_\Delta$ being a slowly changing, near DC voltage having a magnitude that is proportional to the magnitude of the error in duty cycle. In order to ensure the stability of this second-order feedback loop, the pole of the filter for the duty cycle measurement circuit 515 is selected to be the dominant pole of the duty cycle correction feedback loop.

Duty cycle correction circuit 520 receives the differential error voltage $V_\Delta$ and provides a correction current $I_\Delta$ via output terminals C and D in response to the differential error voltage $V_\Delta$ such that the Q output signal has a 50% duty cycle. As shown, output terminals C and D are coupled to output terminals A and B of current switch 202, respectively. The direction in which the correction current $I_\Delta$ flows depends on whether the duty cycle of the Q output signal is less than or more than 50%. The correction current $I_\Delta$ flows from output terminal C when the Q output signal has a duty cycle that is less than 50%. The correction current $I_\Delta$ (as shown in parentheses) flows from output terminal D when the Q output signal has a duty cycle that is more than 50%. The correction current $I_\Delta$ is summed with the output current $I_{out}$ of current switch 202 before being fed into filter 203. The correction current therefore causes one of the triangle wave signals to increase in voltage wherein the other triangle wave signal decreases in voltage such that the zero differential crossing points occur halfway between the rising and falling edges of the input reference clock signal CLK.

Figure 6:
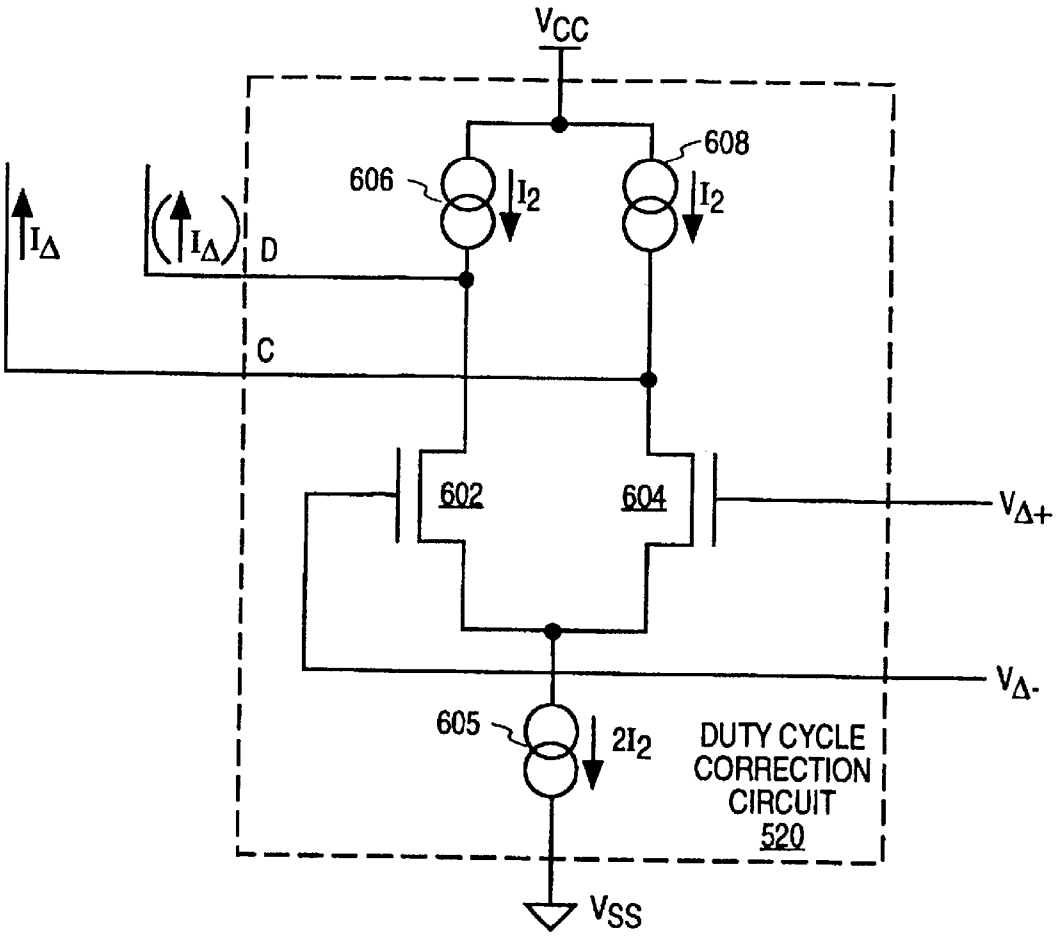
FIG. 6 shows a duty cycle error correction circuit of one embodiment.

According to one embodiment, duty cycle correction circuit 520 is a current switch that switches the correction current $I_{66}$. FIG. 6 shows duty cycle correction circuit 520 as being a current switch that generally comprises a differential pair of matched NMOS transistors 602 and 604 and current sources 605, 606, and 608. Transistor 602 has its gate coupled to receive the $V_{66}$ _ error voltage and its drain coupled to the supply voltage VCC via current source 606. Similarly, transistor 604 has its gate coupled to receive the $V_{66}$ _ error voltage and its drain coupled to VCC via current source 608. The sources of transistors 602 and 604 are commonly coupled to system ground VSS via current source 605. Current sources 606 and 608 each source a current $I_2$, and current source 605 sinks a current of $2I_2$. The current $I_2$ is chosen to be much less than the current $I_1$ used in current switch 202.

Figure 7:
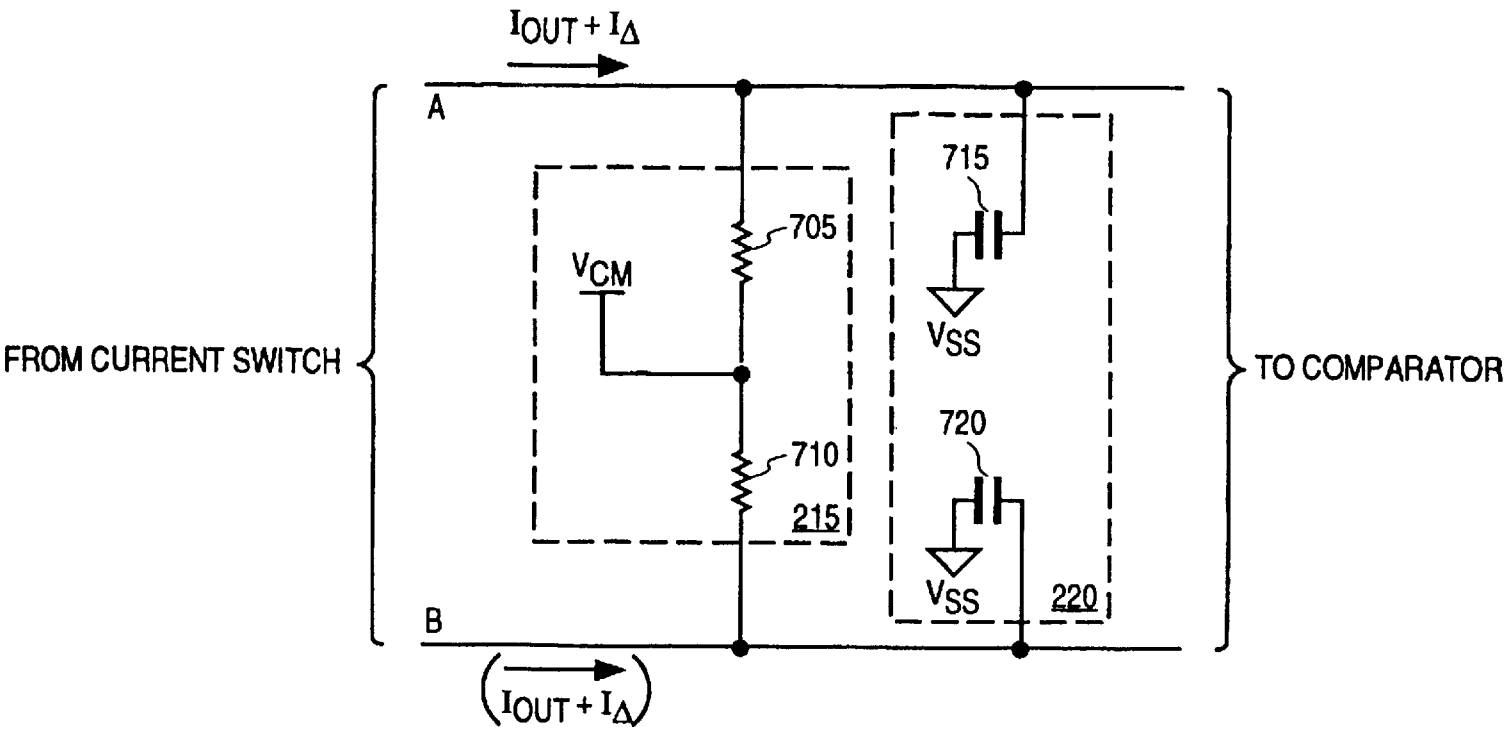
FIG. 7 shows a filter according to one embodiment.

FIG. 7 shows resistor 215 and capacitor 220 of filter 203 according to one embodiment. Resistor 215 is shown as including a first half-value resistor 705 coupled between output terminal A of current switch 202 and a common mode voltage $V_{CM}$, and a second half-value resistor 710 coupled between a common mode voltage $V_{CM}$ and output terminal B of current switch 202. Capacitor 220 is shown as including a first double-value capacitor 715 coupled between output terminal A of current switch 202 and system ground VSS, and a second double-value capacitor 720 coupled between output terminal B and $V_{ss}$.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. A phase shifting circuit comprising:

a first differential amplifier including:

a pair of field effect transistors configured to form a source coupled pair having a common node, and including a pair of inputs for receiving an input reference signal and complement thereof and a pair of output nodes;

first and second current sources coupled respectively between the output nodes and a first supply rail, the first and second current sources sourcing a current value of I amperes: and a third current source coupled between the common node and a second supply rail, the third current source sinking a current value of 2I amperes;

a filter circuit coupled across the output nodes, the filter circuit causing the output nodes of the differential amplifier to produce a pair of complementary triangle wave signals in response to the input reference signal and complement thereof; and a comparator having a pair of inputs coupled to receive the pair of complementary triangle wave signals, the comparator generating an output signal having a predetermined phase relationship with the input reference signal in response to a comparison between the pair of complementary triangle wave signals.

2. The phase shifting circuit of claim 1, wherein the phase shifting circuit is implemented as a CMOS circuit.

3. The phase shifting circuit of claim 1, wherein the phase shifting circuit is implemented on a single semiconductor substrate.

4. The phase shifting circuit of claim 1, wherein the comparator further outputs a complementary output signal, and wherein the phase shifting circuit further comprises:

a duty cycle error measurement circuit configured to receive the output signal and the complementary output signal from the comparator, the duty cycle error measurement circuit generating a pair of error signals in response to the output signals of the comparator deviating from a 50% duty cycle;

a second differential amplifier including a pair of inputs coupled to the pair of error signals and a pair of outputs coupled to the output nodes of the first differential amplifier, the second differential amplifier providing a correction current on one of its outputs such that the output of the comparator has a 50% duty cycle.

5. A quadrature clock generator circuit for generating a first output signal and a second output signal that is approximately 90 degrees out of phase with the first output signal, the clock generator circuit comprising:

a first comparator having a pair of inputs coupled to a pair of complementary input reference signals, the first comparator generating the first output signal in response to the complementary input reference signals;

a phase shifting circuit coupled to the complementary input reference signals, the phase shifting circuit comprising:

(i) a first differential amplifier including:

a pair of field effect transistors configured to form a source coupled pair having a common node, and including a pair of inputs for receiving the complementary input reference signals and a pair of output nodes:

first and second current sources coupled respectively between the output nodes and a first supply rail, the first and second current sources sourcing a current value of I amperes: and a third current source coupled between the common node and a second supply rail, the third current source sinking a current value of 2I amperes;

(ii) a filter circuit coupled across the output nodes, the filter circuit causing the output nodes of the differential amplifier to produce a pair of complementary triangle wave signals in response to the complementary input reference signals: and (iii) a second comparator having a pair of inputs coupled to receive the pair of complementary triangle wave signals, the second comparator outputting the second output signal in response to a comparison between the pair of complementary triangle wave signals.

6. The quadrature clock generator of claim 5, wherein the quadrature clock generator is implemented as a CMOS circuit.

7. The quadrature clock generator of claim 5, wherein the quadrature clock generator is implemented on a single semiconductor substrate.

8. The quadrature clock generator of claim 5, wherein the second comparator further outputs a complementary output signal, and wherein the quadrature clock generator further comprises:

a duty cycle error measurement circuit configured to receive the second output signal and the complementary output signal from the second comparator, the duty cycle error measurement circuit generating a pair of error signals in response to the output signals of the second comparator deviating from a 50% duty cycle; and a second differential amplifier including a pair of inputs coupled to the pair of error signals and a pair of outputs coupled to the output nodes of the first differential amplifier, the second differential amplifier providing a correction current on one of its outputs such that the output of the second comparator has a 50% duty cycle.

9. A delay-locked loop (DLL) comprising:

a quadrature clock generator circuit for outputting a first output signal and a second output signal that is approximately 90 degrees out of phase with the first output signal, the clock generator circuit comprising:

a first comparator having an input coupled to an input reference signal, the first comparator outputting the first output signal in response the input reference signal;

a phase shifting circuit coupled to the input signal, the phase shifting circuit comprising:

a triangle wave generator coupled to receive the input reference signal, the triangle wave generator including a pair of complementary outputs that output a pair of complementary triangle wave signals in response to the input reference signal; and a second comparator having a pair of inputs coupled to receive the pair of complementary triangle wave signals, the comparator outputting the second output signal in response to a comparison between the pair of complementary triangle wave signals;

a variable delay circuit coupled to receive the first and second output signals, the variable delay circuit outputting a delayed signal in response to a control signal;

a clock buffer circuit coupled to receive and buffer the delayed circuit, the clock buffer circuit outputting an output signal of the DLL; and a phase detector coupled to the input reference signal and the output signal of the DLL, the phase comparator generating the control signal in response to a comparison between the input and output signals.

10. The DLL of claim 9, wherein the triangle wave generator comprises:

a filter coupled across the complementary outputs; and a current switch coupled to receive the input reference signal, the current switch providing an output current having a direction of flow from one of the complementary outputs to the other of the complementary outputs, wherein the current switch reverses the direction of flow for the output current in response to the input reference signal, the filter integrating the output current to result in complementary triangle wave signals.

11. The DLL of claim 9, wherein the triangle wave generator comprises:

a differential amplifier including a first input coupled to the input reference signal, a second input coupled to a complementary input reference signal, and the pair of complementary outputs; and a filter coupled across the complementary outputs, the filter causing the complementary outputs of the differential amplifier to output complementary triangle wave signals.

12. A phase shifting circuit comprising:

(a) a current switch coupled to receive a pair of complementary input reference signals and including a pair of complementary outputs, the current switch for coupling to a power supply rail the current switch providing an output current having a direction of flow from one of the complementary outputs to the other of the complementary outputs, wherein the current switch reverses the direction of flow for the output current in response to the pair of complementary input reference signals;

(b) a filter coupled across the complementary outputs and integrating the output current to generate a pair of complementary triangle wave signals, the filter comprising:

(i) a first resistor having a first terminal coupled to one of the complementary outputs and a second terminal coupled to a common mode voltage; the common mode voltage being different than the power supply rail;

(ii) a second resistor having a first terminal coupled to the other complementary output and a second terminal coupled to the common mode voltage; and (iii) capacitive means for providing a capacitance across the complementary outputs; and (c) a comparator having a pair of inputs coupled to receive the pair of complementary triangle wave signals, the comparator generating an output signal having a predetermined phase relationship with the input reference signal in response to a comparison between the pair of complementary triangle wave signals.

13. A quadrature clock generator for generating a first output signal and a second output signal that is approximately 90 degrees out of phase with the first output signal, the clock generator circuit comprising:

(a) a first comparator having a pair of inputs coupled to a pair of complementary input reference signals, the first comparator generating the first output signal in response to the complementary input reference signals;

(b) a phase shifting circuit coupled to the complementary input reference signals, the phase shifting circuit comprising:

(i) a current switch coupled to receive the pair of complementary input reference signals and including a pair of complementary outputs, the current switch for coupling to a power supply rail the current switch providing an output current having a direction of flow from one of the complementary outputs to the other of the complementary outputs, wherein the current switch reverses the direction of flow for the output current in response to the pair of complementary input reference signals;

(ii) a filter coupled across the complementary outputs and integrating the output current to generate a pair of complementary triangle wave signals, the filter comprising:

(1) a first resistor having a first terminal coupled to one of the complementary outputs and a second terminal coupled to a common mode voltage; the common mode voltage being different than the power supply rail;

(2) a second resistor having a first terminal coupled to the other complementary output and a second terminal coupled to the common mode voltage; and (3) capacitive means for providing a capacitance across the complementary outputs; and (iii) a second comparator having a pair of inputs coupled to receive the pair of complementary triangle wave signals, the comparator generating the second output signal in response to a comparison between the pair of complementary triangle wave signals.

*14. A method of operation in a delay-locked loop circuit comprising:*

*generating a first clock signal using complementary input reference signals;*

*generating complementary voltage waveforms that alternate between falling and rising voltage transitions in response to transitions of the complementary input reference signals, crossing points of the complementary voltage waveforms being phase offset with respect to the transitions of the complementary input reference signals;*

*generating a second clock signal that transitions in response to the crossing points of the complementary voltage waveforms;*

*generating a third clock signal by phase mixing the first and second clock signals in response to a control signal; and*

*generating the control signal based on a phase difference between one of the complementary input reference signals and the third clock signal.*

*15. The method of claim 14 wherein the control signal is a digital value.*

*16. The method of claim 14 wherein the control signal is an analog voltage.*

*17. The method of claim 14 further comprising adjusting a duty cycle of the complementary voltage waveforms based on feedback derived from the second clock signal.*

*18. The method of claim 14 wherein the second clock signal is quadrature phase offset with respect to the first clock signal.*

*19. The method of claim 14 wherein generating complementary voltage waveforms further comprises:*

*generating first and second currents using respective first and second current sources that source current from a supply potential to respective first and second nodes;*

*steering the first current from the first node to a third node in response to a first state of the complementary input reference signals; and*

*steering the second current from the second node to the first node via a resistive element, the first and second currents producing a first voltage transition at the first node.*

*20. The method of claim 19 further comprising:*

*sourcing a third current from the third node, the third current being at least the sum of the first and second currents; and*

*reversing a direction of current flow through the resistive element when the complementary input reference signals change logic states.*

*21. A phase shifting circuit comprising:*

*first and second current sources to generate respective first and second currents at respective first and second nodes;*

*a first current switch to steer current from the first node to a third node in response to a first state of a reference signal, and to steer current from the first node to the second node via a resistive element in response to a second state of the reference signal;*

*a second current switch to steer current from the second node to the first node via the resistive element when the reference signal is in the first state to produce a first voltage transition at the first node, and to steer current from the second node to the third node when the reference signal is in the second state;*

*a capacitor element to slew rate limit the first voltage transition at the first node;*

*a third current source to sink a third current from the third node, the third current having a magnitude that is at least double that of the first current; and*

*a comparator circuit coupled to the first and second nodes to generate an output signal having a phase shift with respect to the reference signal in response to the first voltage transition.*

*22. The phase shifting circuit of claim 21 wherein the first and second current switches comprise respective first and second transistors receiving the reference signal and a complement thereof at respective gate inputs.*

*23. The phase shifting circuit of claim 21 wherein the resistive element is coupled between the first and second nodes, and the capacitor element is coupled between the first and second nodes.*

*24. The phase shifting circuit of claim 21 wherein the resistive element comprises a first resistor coupled between a second supply potential and the first node, and a second resistor coupled between the second supply potential and the second node.*

*25. The phase shifting circuit of claim 21 wherein the first and second currents produce a second voltage transition at the second node when the reference signal is in the first state.*

*26. The phase shifting circuit of claim 25 wherein the comparator comprises a first input coupled to the first node, and a second input coupled to the second node.*

*27. The phase shifting circuit of claim 21 wherein the third current source sources the third current to a ground potential node.*

*28. A method of operation in a phase shifting circuit, the method comprising:*

*generating first and second currents using respective first and second current sources that source current from a supply potential to respective first and second nodes;*

*steering current from the first node to a third node in response to a first state of a reference signal, and from the first node to the second node via a resistive element in response to a second state of the reference signal;*

*steering current from the second node to the first node via the resistive element in response to the first state of the reference signal, and from the second node to the third node in response to the second state of the reference signal, a first voltage transition being produced at the first node and a second voltage transition being produced at the second node when the reference signal is in the first state;*

*slew rate limiting the first and second voltage transitions;*

*sinking a third current from the third node, the third current being at least the sum of the first and second currents;*

*reversing a direction of current flow through the resistive element when the reference signal changes states; and*

*generating an output signal by detecting crossing points of the first and second voltage transitions, the output signal having a phase shift with respect to the reference signal.*

*29. The method of claim 28 wherein the first and second voltage transitions are complementary.*

*30. The method of claim 28 wherein during the second state of the reference signal, a third voltage transition is produced at the first node, and a fourth voltage transition is produced at the second node, the third voltage transition being complementary to the first voltage transition.*

*31. The method of claim 28 wherein generating the output signal comprises comparing the first and second voltage transitions to detect the crossing points thereof.*

*32. The method of claim 28 wherein the current steered from the second node is steered in response to a signal that is complementary to the reference signal.*

*33. The method of claim 28 wherein the third current is sunk from the third node to a ground potential node.*

*34. The method of claim 28 wherein the phase shift is at least ninety degrees.*

*35. The method of claim 28 wherein slew rate limiting the first voltage transition at the first node is performed using a capacitor.*

*36. A delay-locked loop circuit comprising:*

*a current switch circuit to generate complementary voltage waveforms that alternate between falling and ris-*

*ing voltage transitions in response to transitions of complementary input reference signals, crossing points of the complementary voltage waveforms being phase offset with respect to the transitions of the complementary input reference signals;*

*a first comparator circuit to compare the complementary voltage waveforms to one another and generate a first clock signal that transitions in response to detection of crossing points of the complementary voltage waveforms;*

*a phase mixer circuit to generate a second clock signal by phase mixing the first clock signal and a clock signal generated using one of the complementary input reference signals; and*

*a phase detector circuit to generate the control signal based on a phase difference between a first input reference signal of the complementary input reference signals and the second clock signal.*

*37. The delay-locked loop of claim 36 wherein the control signal is a digital value.*

*38. The delay-locked loop of claim 36 wherein the control signal is an analog voltage.*

*39. The delay-locked loop of claim 36 further comprising a duty cycle adjustment circuit coupled to the current switch circuit to adjust a duty cycle of the complementary voltage waveforms.*

*40. The delay-locked loop of claim 36 wherein the current switch circuit comprises:*

*a first transistor to steer a first current of a pair of currents from a first node to a third node in response to a first state of the complementary input reference signals, and from the first node to a second node via a resistive element in response to a second state of the complementary input reference signals; and*

*a second transistor to steer a second current of the pair of currents from the second node to the first node via the resistive element in response to the first state of the complementary input reference signals, and from the second node to the third node in response to the second state of the complementary input reference signals; and*

*a third current source to sink a third current from the third node, the third current being at least the sum of the first and second currents.*

*41. The delay-locked loop of claim 40 wherein a direction of current flow through the resistive element is reversed when the complementary input reference signals change states.*

*42. The delay-locked loop of claim 36 further comprising a second comparator circuit to compare the complementary input reference signals to one another and output the clock signal, the second comparator circuit being delay matched to the first comparator circuit.*

* * * * *